United States Patent [19]

Harris

[11] Patent Number: 4,920,281

[45] Date of Patent: Apr. 24, 1990

[54] PROXIMITY SWITCH CIRCUIT

[75] Inventor: Geoffrey J. Harris, Swindon, United Kingdom

[73] Assignee: Square D Company, Palatine, Ill.

[21] Appl. No.: 244,548

[22] Filed: Sep. 12, 1988

Related U.S. Application Data

[63] Continuation of Ser. No. 5,318, Jan. 16, 1987, abandoned, which is a continuation of Ser. No. 588,876, filed as PCT GB83/00149 on Jun. 7, 1983, published as WO83/04458 on Dec. 22, 1983, abandoned.

[30] Foreign Application Priority Data

Jun. 11, 1982 [GB] United Kingdom ................ 8217084

[51] Int. Cl.$^5$ ........................ H01H 36/00; H03B 5/12
[52] U.S. Cl. .................................... 307/308; 307/116; 328/5; 361/179; 340/552
[58] Field of Search .................... 307/308, 116; 328/5, 328/65; 361/179–181; 340/55, 552; 331/65

[56] References Cited

U.S. PATENT DOCUMENTS

| | | | |
|---|---|---|---|
| 3,743,865 | 7/1973 | Riechmann | 328/5 |
| 3,747,010 | 7/1973 | Buck | 331/65 |
| 3,872,398 | 3/1975 | Fausone et al. | 331/65 |
| 3,919,661 | 11/1975 | Buck | 331/65 |
| 3,935,542 | 1/1976 | Buck | 331/65 |
| 4,138,709 | 2/1979 | Colwill | 361/180 |

FOREIGN PATENT DOCUMENTS 1216041 12/1986 Canada.
2493560 5/1982 France.

Primary Examiner—Stanley D. Miller
Assistant Examiner—Terry Cunningham
Attorney, Agent, or Firm—Michael J. Femal; A. Sidney Johnston

[57] ABSTRACT

The circuit operates a main switch SCR to pass an a.c. supply V through a load L when a metallic object is in proximity to coil L1. Coil L1 is driven by an oscillator comprising transistor T2 and associated components. SCR is gated on simultaneous occurrence of an output from level detector T3 and a signal from T5, these being ANDed by T4. The timing of the signal from T5 in the supply cycle is governed by the RC time constant of C4,Z1,R14 and is such that the power supplied to the oscillator and level detector is the minimum necessary, for a wide range of supply voltage and load current.

15 Claims, 2 Drawing Sheets

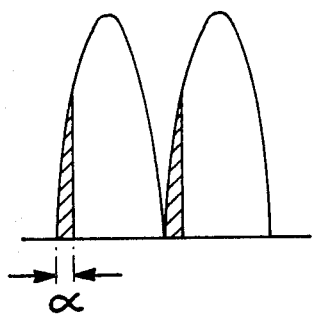
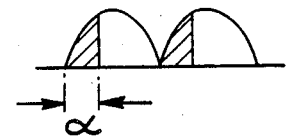
Fig. 2a       Fig. 2b
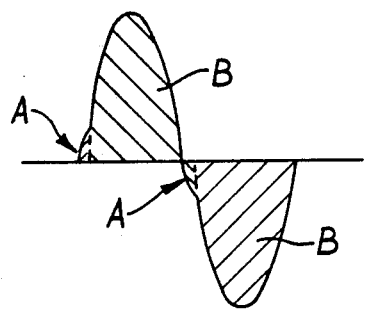
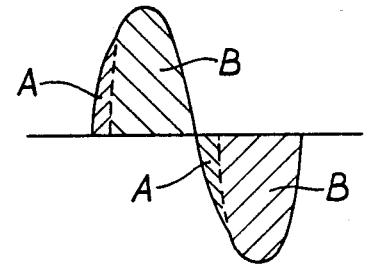
Fig. 3a       Fig. 3b

PROXIMITY SWITCH CIRCUIT

This is a continuation of co-pending application Ser. No. 005,318 filed on Jan. 16, 1987 which is a continuation of application Ser. No. 588,876, filed as PCT GB83/00149 on Jun. 7, 1983, published as WO83/04458 on Dec. 22, 1983, both now abandoned.

BACKGROUND OF THE INVENTION

This invention relates to proximity switches of the type in which an induction coil is driven by an oscillator and the presence of a metallic object in proximity to the switch causes a change in the amplitude of oscillation which is detected by a detector circuit to close a switching element such as a transistor or thyristor.

Such devices are well known in principle, one example being described in our British Pat. No. 1531217.

It is desirable in such switches to have a low dissipation in the switch and a minimum voltage drop across the switch when in its "on" condition, and one object of the present invention is to provide a proximity switch circuit which furthers these aims.

A disadvantage of switches hitherto known is that they were usable only for a limited range of applied voltages, and it was necessary for the manufacturer to provide a range of switches for use with the range of voltages met in industrial practice. A further object of the invention is therefore to provide a proximity switch circuit which can be used with a wide range of applied voltages, but without dissipating an unacceptable amount of power at the higher applied voltages.

SUMMARY OF THE INVENTION

Accordingly, the invention provides a proximity switch for use with an a.c. supply to control a load connected in circuit with the switch, the switch comprising:

a power supply including a storage capacitor;
an induction coil;
an oscillator connected to drive the coil;
a level detector connected to the oscillator to provide a detector output signal in response to reduction in the amplitude of oscillation caused by proximity of a metallic object to the coil; and
a controllable switching element connected, in use, across said a.c. supply and having a control input;
characterised by control means arranged to energise the switching element control input on the simultaneous occurrence of a detector output signal and said storage capacitor attaining a voltage having a predetermined relation to the supply voltage, whereby the oscillator and the level detector are supplied with only a minimum amount of power required for their operation.

Preferably, the power supply comprises a Zener diode controlling the voltage applied to the storage capacitor, and a transistor regulator circuit arranged to maintain a controlled current through the Zener diode.

Preferably also, the control means comprises gating means, e.g. a transistor.

The switching element is suitably a thyristor or triac.

An embodiment of the invention will now be described, by way of example, with reference to the accompanying drawings, in which:

BRIEF DESCRIPTION OF THE DRAWINGS

FIGS. 2a and 2b illustrate waveforms in the circuit; and

FIGS. 3a and 3b illustrate load current waveforms.

DETAILED DESCRIPTION OF THE INVENTION

Figure 1:
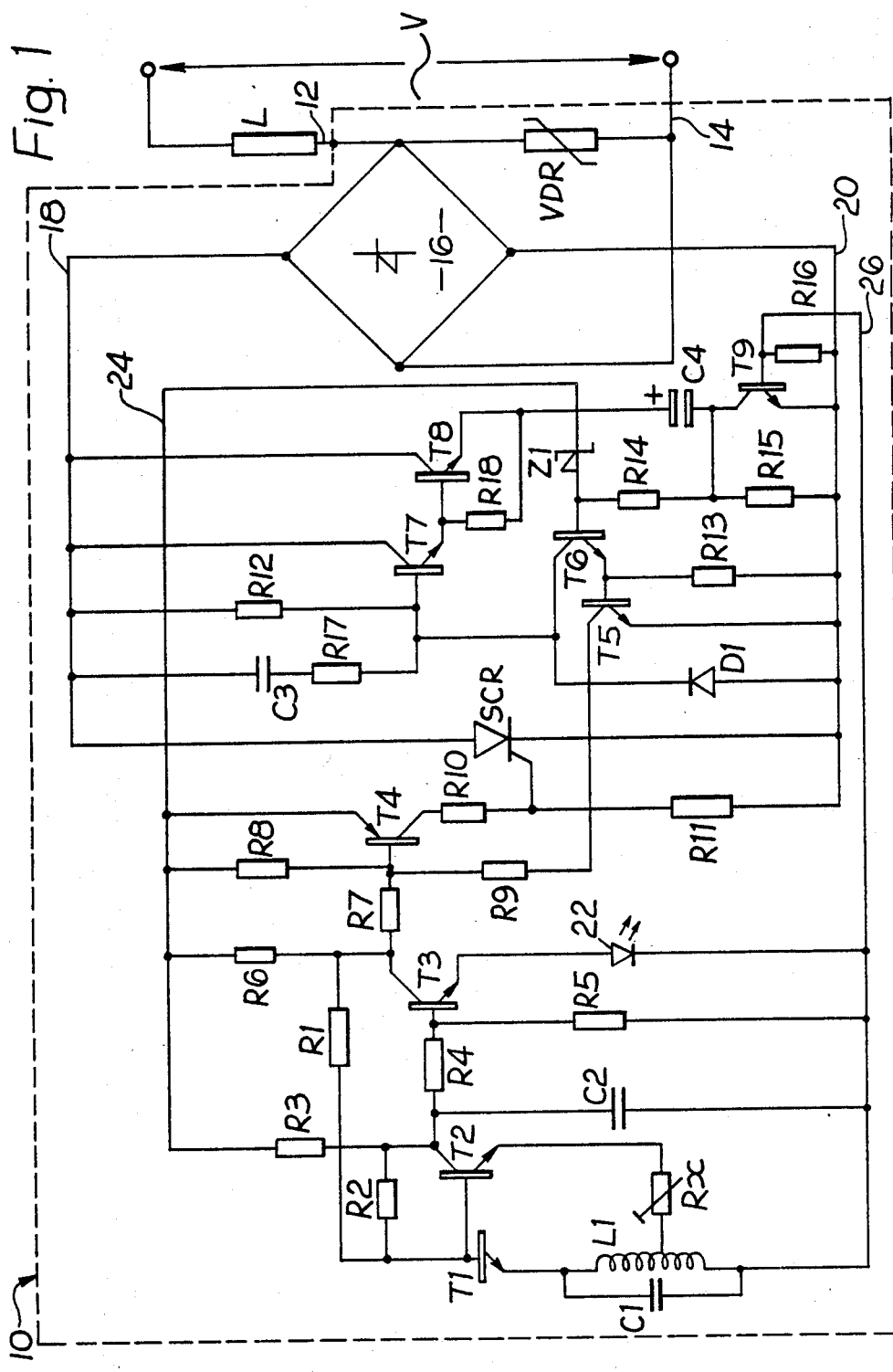
FIG. 1 is a circuit diagram of a circuit embodying the invention.

The circuit 10 of FIG. 1 is intended to be encapsulated in a case and connected by wires 12,14 to a voltage source V via a load L which may be a controlled device or a relay coil or the like. The voltagle V in the present embodiment may be in the range 24 V-240 V. VDR is a metal oxide varistor to provide protection to the switch against external voltage transients above some 280 V. One example of a suitable physical construction of the switch is shown in our copending International patent application No. PCT/GB81/00226.

A full-wave rectifier bridge 16 applies rectified current to lines 18,20. When the switch is "on", a thyristor SCR conducts in a controlled manner to be described, causing current to be passed through the load L.

An induction coil L1 is driven by an oscillator comprising transistors T1 and T2, capacitor C1, and resistors R1,R2,R3 and Rx. The resistor Rx is trimmed during manufacture to adjust the sensitiviy of the switch. The connection of the base-emitter path of transistor T1 to the base of transistor T2 assists in compensating for temperature drift. Capacitor C2 maintains curret in R3 during the half-cycle that T2 is non-conducting.

The presence of a metal object in proximity to the coil L1 loads the oscillator, reduces the amplitude of oscillation, and causes a reduction in the collector current of transistor T2 by diverting current from the base of T2 via the base-emitter of T1.

The reduction in collector current of T2 is sensed by a level detector circuit comprising transistor T3, light-emitting diode (l.e.d.) 22, and resistors R4-R6. Transistor T3 is normally off due to the relatively high voltage drop across resistor R3. When metal approaches the coil L1, the action described above raises the voltage at the collector or T2, driving T3 on. Resistor R1 provides a degree of feedback to the base of transistor T2; this feedback is reduced when T3 conducts, thus giving the level detector a snap-action or hysteresis effect. Conduction of T3 causes the l.e.d. 22 to illuminate, thus giving a visual indication of the state of the switch.

The thyristor SCR is controlled by transistor T4 in combination with the power supply circuit to be described. In essence, transistor T4 acts as an AND gate to trigger thyristor SCR when T3 is on and at a point in the voltage half-cycle determined by the power supply circuit. This firing point is so arranged that the power supplied to the oscillator and level detector circuits is no more than sufficient for their operation, and thus the firing angle is small for high supply voltages and larger for low supply voltages.

The power supply circuit comprises a Zener diode Z1 to control the maximum voltage level across lines 20 and 24 and a storage capacitor C4. Transistors T6, T7 and T8 regulate the current through the Zener diode Z1 when the thyristor SCR is non-conducting. Transistors T7 and T8 are connected as a high-gain Darlington circuit to set the required quiescent current over a wide range of applied voltage. Resistor R18 diverts leakage current from T7 away from T8 base-emitter circuit so that this leakage current, particularly under high temperature conditions, does not cause transistor T8 to turn on.

When the switch is in the "off" state, transistor T4 and hence thyristor SCR are non-conducting. Full supply voltage is available at the output of the rectifier bridge 16 and is applied to the regulator circuit consisting of transistors T6,T7,T8, Zener diode Z1 and resistor R14. The current flowing into the Zener diode Z1 may be adjusted by altering the value of R14. Regulation will occur when the current flowing in Z1 and R14 is sufficient to raise the voltage developed across R14 to overcome the base-emitter voltage of T6, causing T6 to conduct current away from the base of T7. This arrangement ensures that the current flowing in the Zener diode Z1 remains stable with wide variations in the supply voltage and in the load current taken out of C4.

When the switch changes to the on state, the gate firing signal for the thyristor SCR is controlled by the transistor T5 which is forced into conduction when the current flowing in Z1 and R14 is sufficient to raise the voltage developed across R14 to overcome the base-emitter voltages of T5 and T6; that is, the firing angle is set by the charging time constant of the circuit C4, Z1, R14. The result is that for a high applied voltage the firing angle $\alpha$ is small, as seen in FIG. 2a, while for a low applied voltage $\alpha$ is relatively large, as seen in FIG. 2b. In both cases the power supplied to the oscillator and level detector is the same, this being represented by the shaded areas in FIGS. 2a and 2b.

Capacitor C3 provides an additional current path in parallel with resistor R12 to provide some additional base drive current into T7 when the output of the switch is in the on state. Resistor R17 provides some limitation to the current through C3. Diode D1 provides a discharge path for C3 during the portion of each half cycle when SCR is conducting so that it is discharged sufficiently at the beginning the following half cycle.

The net result is that the circuit adjusts the time that SCR remains off such that just sufficient power is provided to operate the regulator, for all values of applied voltage and load resistance.

So far as the load is concerned, however, the applied waveform is virtually a full sine wave. As shown in FIG. 3a, for a high current the load current comprises a small time interval A where flow is through the regulator and a large time interval B where it is through SCR. For a low load current, the area A is relatively larger, as shown in FIG. 3b. The resulting load current in each case is slightly distorted from a true sine wave owing to the effect of the storage capacitor C4.

The circuit of FIG. 1 also provides a time delay to prevent momentary energization of the load on switch-on of the supply.

It is usual in prior art switches to provide such a delay by means of an additional RC network acting directly on the output switching device. One advantage of the circuit of FIG. 1 is that the output SCR cannot be switched on until the Zener diode Z1 is regulating and conducting current, which removes the need for an additional timing circuit. However the capacitor C4 can take a relatively high charging current for a short period of time on switch-on via the Darlington pair T7,T8. This is reduced to acceptable limits by the provision of transistor T9 and resistors R15,R16. At switch-on, the charging current of capacitor C4 flows into R15 thus causing a voltage to be applied to the base of T6 via R14. The transistor T6 thus conducts and diverts current from the base of T7, thus limiting the output current from T8 into C4, thereby controlling the switch-on surge. Once C4 has charged, current in the oscillator circuit flows via line 26 to turn on transistor T9. Thus in normal operation the lower ends of R14 and C4 are effectively connected directly to the negative line 20, R15 being shunted by T9. The inclusion of T9 across R15 permits the value of R15 to be made high enough to limit the initial charging current of C4 to a level comparable with the normal steady off-state leakage current of the switch. Without T9 such a high value of R15 would adversely affect normal operation of the switch. For most practical applications however it is not necessary for the initial charging current of C4 to be limited to such an extent. In this case T9 and R16 may be omitted and line 26 from the oscillator joined directly to line 20. The value of R15 is then chosen to be high enough to limit the initial charging current of C4 such that insufficient energy is passed to actuate the load, but not so high as would adversely affect normal operation of the switch.

There has thus been described and improved proximity switch circuit whose off-state leakage current is essentially the same over a wide range of applied voltages. The invention makes it possible to use one standard design to cope with a wide range of voltage supplies. For example, one switch according to the invention has the following characteristics:

| | |
| --- | --- |
| Applied voltage | 24 V–240 V |
| Load current | 5 mA–300 mA |
| Off state leakage current | 2 mA max. |

I claim:
1. A proximity switch for use with a wide range of AC supply voltages to control a wide range of load currents, comprising:
   an AC supply voltage
   an induction coil;
   an oscillator electrically connected to the induction coil for driving said induction coil;
   a detector means electrically connected to said oscillator for generating a detector output signal in response to the proximity of a metallic object to said coil;
   a rectifier means connected in series with said AC supply voltage and said load for generating a DC output voltage;
   a storage capacitor means electrically connected to said induction coil oscillator and detector means capable of being charged by the DC output voltage of said rectifier means to a predetermined level for supplying operating power to said induction coil, said oscillator, and said detector means,
   switching means electrically connected across said rectifier means, responsive to said detector means output signal, for closing to short said DC output of said rectifier means when said switching means is closed, and said closing of said switching means increases AC curret flow through said load and removes charging current from said storage capacitor means to operate the induction coil, oscillator, detector means in shorted condition;
   opening means connected to said storage capacitor means, responsive to a voltage across said storage capacitor means, for opening said switching means, for applying charging current to said storage capacitor means;

a regulator circuit means for controlling a maximum voltage across said storage capacitor means that results in a low off-state leakage current that essentially remains the same over a wide range of AC supply voltages connected to the proximity switches; and circuit means responsive to said detector means output signal, for periodically repeating said closing and said opening of said switching means, whereby said storage capacitor means supplies sufficient power to operate said induction coil, said oscillator, and said detector means in the event that said metallic object is in the proximity of said induction coil.

2. A proximity switch according to claim 1, in which the switching means comprises an AND circuit connected to receive said detector means output signal and the output of a switching element controlled by a RC time constant of said storage capacitor means and a resistance in parallel therewith.

3. A proximity switch according to claim 1 further comprising regulated power supply means for controlling the maximum voltage across said capacitor.

4. A proximity switch according to claim 3, in which said regulated power supply means further comprises a Zener diode and a transistor circuit controlling current flow through the Zener diode.

5. A proximity switch according to claim 4, in which said transistor circuit comprises a Darlington pair.

6. A proximity switch for use with a wide range of AC supply voltages and load current to control a load in series therewith; comprising:
an AC supply voltage
an induction coil;
an oscillator circuit means electrically connected to said induction coil for driving said induction coil;
a detector circuit means electrically connected to said oscillator circuit means for generating a detector output signal in response to the proximity of a metallic object to said coil;
a recetifier circuit means electrically connected in series with said AC supply voltage and said load for generating a DC output voltage;
a storage capacitor means electrically connected to said induction coil, oscillator circuit means, detector circuit means, and rectifier circuit means capable of being charged by the DC output voltage of said rectifier circuit means to a predetermined voltage, for supplying operating power to said induction coil, said oscillator, and said detector;
a regulator circuit means electrically connected to said storage capacitor means responsive to the wide range of AC supply voltages in flow of current out of said storage capacitor means for generating the same operating power supplied to the oscillator and detector circuit means whether the AC supply voltage is low or high to the proximity switch;
a switch means having an input connected to the detector means output signal and to the output of the storage capacitor means, responsive to the presence of output signals from both the detector and storage circuit means to switch to a closed position for shorting said DC output of said rectifier circuit means said shorting of said DC output of said rectifier circuit means increases AC current flow through said load and removed charging current from said storage capacitor means to operate the proximity switch; and opening means, responsive to a voltage across said storage capacitor, for opening said switching means, and said opening of said switching means applies a charging current to said storage capacitor means.

7. The apparatus as in claim 6, wherein said opening means further comprises:
an AND circuit means connected to receive said detector means output signal, and said AND circuit means connected to receive an output of the storage capacitor means having a switching element, said switching element controlled by a RC time constant of said storage capacitor and a resistance in parallel therewith.

8. The apparatus as in claim 7, wherein said regulator circuit means further comprises:
a Zener diode and a transistor circuit controlling current flow through said Zener diode.

9. The apparatus as in claim 8, wherein said transistor circuit further comprises a Darlington pair.

10. The apparatus as in claim 6, wherein, said switching means, responsive to said detector output signal and the output of storage capacitor means, switches into conduction for a first predetermined time period and into non-conduction for a first predetermined time period and into non-conduction for a second predetermined time period, said load having a substantially AC sinewave current flowing therethrough, and said sinewave having a first part of a cycle flowing through said switching means and a second part of said cycle flowing to charge said storage capacitor means.

11. A proximity switch for use with an AC supply to control a load, comprising:
an induction coil;
an oscillator means connected to the coil for driving said induction coil;
a detector means connected to said oscillator means for generating a detector output signal in response to proximity of a metallic object to said coil;
a rectifier means connected to the oscillator means and in series with said AC supply and said load for generating a DC voltage;
a storage capacitor means connected to the induction coil, oscillator means and detector means capable of being charged by the DC output voltage of said rectifier means to a predetermined level, said storage capacitor means supplying operating power to said induction coil, said oscillator means, and said detector means;
switching means connected across said rectifier means and to said detector means, responsive to said detector means output signal, for closing to short said DC output of said rectifier means when said switching means is closed, and said closing of said switching means increases AC current flow through said load and removed charging current from said storage capacitor means;
opening means connected to the storage capacitor means, responsive to a voltage across said storage capacitor means, for opening said switching means, and said opening of said switching means applying charging current to said storage capacitor; and wherein said switching means, responsive to said detector output signal for periodically repeating the said closing and said opening thereof, whereby said storage capacitor means supplies sufficient power to operate said induction coil, said oscillator means, and said detector in the event that said metallic object is in the proximity of said induction coil.

12. A proximity switch for use with a wide range of AC supply voltages to control a load comprising:
   an AC supply voltage
   an induction coil;
   an oscillator means connected to the coil for driving said induction coil;
   a detector means connected to said oscillator for generating a detector output signal in response to proximity of a metallic object to said induction coil;
   a rectifier means connected in series with said AC supply voltage and said load and to the coil, oscillator and detector means for generating a DC voltage;
   a storage capacitor means connected to the oscillator means capable of being charged by the DC output voltage of said rectifier means, said storage capacitor means connected to supply operating power to said induction coil, said oscillator, and said detector;
   a solid state switch connected across the output of said rectifier means and having an input responsive to said detector means output signal for switching to and "on" condition to short said DC output voltage of said rectifier means increases AC current flow through said load and removes charging current from said storage capacitor means;
   a switching element connected to the storage capacitor means having an output voltage controlled by the voltage across said storage capacitor means;
   an AND circuit connected to the input of said switch having a first input connected to receive said detector means output signal, having a second input to receive the output voltage of said switching element, and having an output signal connected to the input of said solid state switch to turn said solid state switch "on" when said first input is at a first predetermined voltage level and said second input is at a second predetermined voltage level, said switching element capable of changing said output voltage from a value on said second predetermined voltage level when a voltage across said storage capacitor means falls below a third predetermined voltage level, and said AND current capable of turning said solid state switch into an "off" condition in the event of a change in said output voltage of said switching element below the third predetermined voltage level; and
   said AND circuit periodically turns said solid state switch "on" and "off" when said detector signal indicates the proximity of a metallic object to said induction coil, and when said solid state switch is "off" said storage capacitor means is charged, and a substantially sinusoidal current flows through said load with a first part of a cycle of said substantially sinusoidal currennt flowing through said solid state switch and a second part of said cycle of said substantially sinusoidal current flowing thru said rectifier to charge said storage capacitor means.

13. A proximity switch as in claim 12 wherein said solid state switch is a thyristor.

14. A method for operating a proximity switch, said proximity swtich for use with a wide range of AC supply voltages and a load, of the type having an AC supply voltage, an induction coil, an oscillator connected to drive said induction coil, a detector connected to said oscillator to provide a detector output signal in response to proximity of a metallic object to said induction coil, comprising:
   providing a rectifier connected in series with said AC supply and said load for generating a DC voltage;
   providing a storage capacitor capable of being charged by the DC output of said rectifier;
   regulating the charging of the storage capacitor to a low off state leakage current of the proximity switch that essentially remains the same over the wide range of AC supply voltages;
   supplying operating power from said storage capacitor to said induction coil, said oscillator, and said detector;
   closing a switching means, in response to said detector output signal, to short said DC output of said rectifier when said switching means is closed, and said closing of said switching means increases AC current flow through said load and removes charging current from said storage capacitor until the capacitor drops below a predetermined voltage;
   opening said switching means when a voltage across said storage capacitor drops to a predetermined level, and the opening of said switching means applies a charging current to said storage capacitor;
   periodically repeating said closing and opening of said switching means, and said storage capacitor supplies sufficient power to said induction coil, said oscillator, and said detector in the event that said metallic object is in the proximity of said induction coil.

15. The method of claim 14 wherein said closing a switching means comprises:
   turning a thyristor "on". 448

* * * * *